(12) United States Patent
Kim (10) Patent No.: US 8,942,021 B2
(45) Date of Patent: Jan. 27, 2015

(54) SEMICONDUCTOR DEVICE

(75) Inventor: Tae-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 177 days.

(21) Appl. No.: 13/596,873

(22) Filed: Aug. 28, 2012

(65) Prior Publication Data

US 2013/0294133 A1 Nov. 7, 2013

(30) Foreign Application Priority Data

May 3, 2012 (KR) ........................ 10-2012-0047066

(51) Int. Cl.
*G11C 5/06* (2006.01)

(52) U.S. Cl.
USPC .......... 365/63; 365/230.03; 365/51; 365/203; 365/220

(58) Field of Classification Search
USPC .................. 365/63, 233, 230.03, 189.01, 51, 365/230.08, 201, 203, 220
See application file for complete search history.

(56) References Cited

U.S. PATENT DOCUMENTS 6,205,062 B1 * 3/2001 Kim et al. ..................... 365/193

FOREIGN PATENT DOCUMENTS

| KR | 1019990013926 | 2/1999 |
|----|---------------|--------|
| KR | 1020060004782 | 1/2006 |
| KR | 1020060091424 | 8/2006 |
| KR | 1020070000034 | 1/2007 |
| KR | 100780633 | 11/2007 |

* cited by examiner

*Primary Examiner* — Vanthu Nguyen
*Assistant Examiner* — Mohammed A Bashar
(74) *Attorney, Agent, or Firm* — IP & T Group LLP (57) ABSTRACT

A semiconductor device includes: an I/O circuit configured to input/output a data signal; a plurality of internal circuits configured to transmit and receive the data signal to/from the I/O circuit; and a path provider configured to select one of a direct path to a target internal circuit or an indirect path to the target internal circuit that is longer than the direct path in response to one or more path control signals and use the selected path when the data signal is transmitted between the I/O circuit and the plurality of internal circuits.

19 Claims, 6 Drawing Sheets

SEMICONDUCTOR DEVICE

CROSS-REFERENCE TO RELATED APPLICATIONS

The present application claims priority of Korean Patent Application No. 10-2012-0047066, filed on May 3, 2012, which is incorporated herein by reference in its entirety.

BACKGROUND

1. Field

Exemplary embodiments of the present invention relate to semiconductor design technology, and more particularly, to a semiconductor device.

2. Description of the Related Art

In general, a semiconductor device such as DRAM (Dynamic Random Access Memory) includes a plurality of banks that transmit and receive data through a global I/O line.

Figure 1:
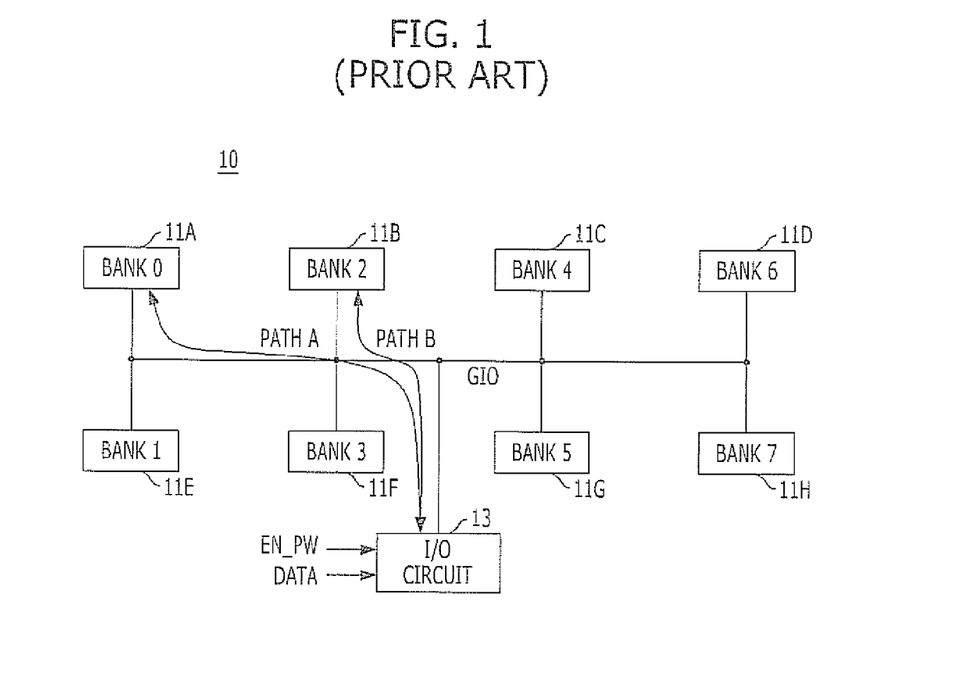
FIG. 1 is a block diagram of a conventional semiconductor device.

FIG. 1 is a block diagram of a conventional semiconductor device.

Referring to FIG. 1, the semiconductor device 10 includes first to fourth banks 11A to 11D arranged in parallel at a certain distance from each other in an upper region, fifth to eighth banks 11E to 11H arranged in a lower region so as to oppositely face the first to fourth banks 11A to 11D, respectively, an I/O circuit 13 configured to transfer data between the first to eighth banks 11A to 11H and an external device, and a global I/O line GIO configured to electrically connect the first to eighth banks 11A to 11H with the I/O circuit 13.

In the semiconductor device 10 having the above-described configuration, distances from the I/O circuit 13 to the first to eighth banks 11A to 11H are different, respectively. That is, the lengths of the global I/O line GIO are different for different banks, respectively. Therefore, data skew may occur according to different line loading conditions. For example, as illustrated in FIG. 1, since a distance between the I/O circuit 13 and the first bank 11A (path A) is different from a distance between the I/O circuit 13 and the second bank 11B (path B), data skew occurs according to differences in the paths.

Figure 2:
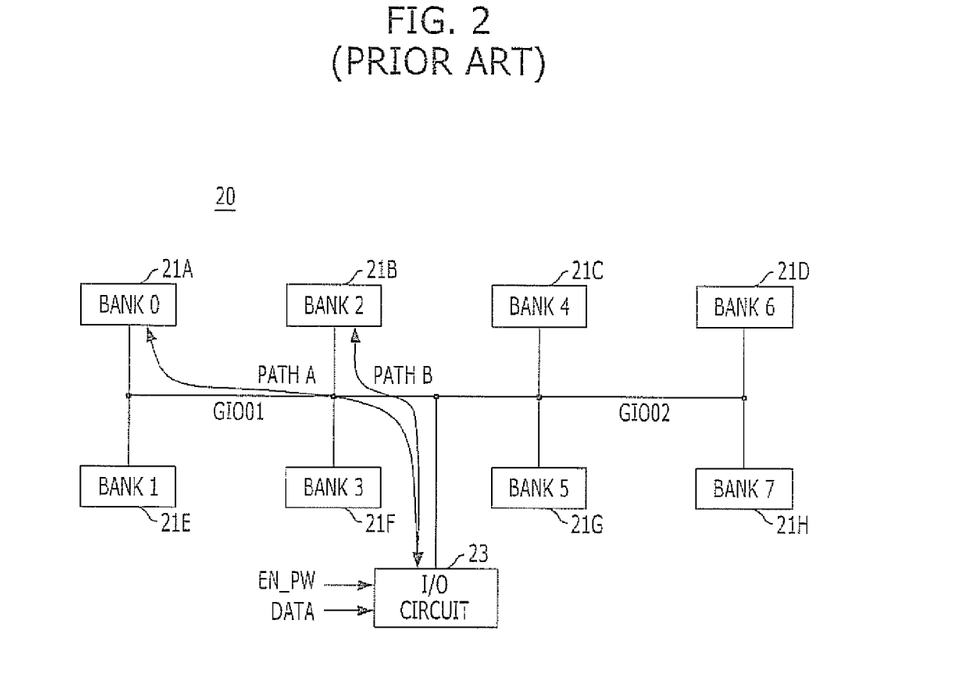
FIG. 2 is a block diagram of another conventional semiconductor device.

FIG. 2 is a block diagram of another conventional semiconductor device.

Referring to FIG. 2, the semiconductor device 20 includes first to fourth banks 21A to 21D arranged in parallel at a certain distance from each other in an upper region, fifth to eighth banks 21E to 21H arranged in a lower region so as to oppositely face the first to fourth banks 21A to 21D, respectively, an I/O circuit 23 configured to transfer data between the first to eighth banks 21A to 21H and an external device, a first global I/O line GIO01 configured to electrically connect the I/O circuit 23 with the banks 21A, 21B, 21E, and 21F, which are arranged in the left side among the first to eighth banks 21A to 21H, and a second global I/O line GIO02 configured to electrically connect the I/O circuit 23 with the bands 21C, 21D, 21G, and 21H, which are arranged in the right side among the first to eighth banks 21A to 21H.

The semiconductor device 20 having the above-described configuration may correct data skew to some extent through the global I/O lines GIO01 and GIO02 when compared to the semiconductor device 10 illustrated in FIG. 1. However, data skew still occurs according to a path characteristic between different paths, for example, 'path A' and 'path B', of each global I/O line.

Thus, different techniques have been developed to address the above features of the above-described semiconductor devices 10 and 20. For example, Korean Patent Laid-Open Publication No. 1999-0013926 (hereinafter, referred to as "Prior Art 1") discloses a technique for equalizing signal delay times using a plurality of data paths, and Korean Patent No. 10-0780633 (hereafter, referred to as "Prior Art 2") discloses a technique for reducing skew depending on the distance using a plurality of delay circuits. However, since Prior Art 1 Includes the plurality of data paths and Prior Art 2 includes the plurality of delay circuits, they increase the circuit area.

SUMMARY

An embodiment of the present invention is directed to a semiconductor device capable of reflecting the same line loading regardless of the positions of internal circuits and having a minimized area.

In accordance with an embodiment of the present invention, a semiconductor device includes: an I/O circuit configured to input/output a data signal; a plurality of internal circuits configured to transmit and receive the data signal to/from the I/O circuit; and a path provider configured to select one of a direct path to a target internal circuit or an indirect path to the target internal circuit that is longer than the direct path in response to one or more path control signals and use the selected path when the data signal is transmitted between the I/O circuit and the plurality of internal circuits.

In accordance with another embodiment of the present invention, a semiconductor device includes: an I/O circuit configured to input/output data; a plurality of banks configured to store data transferred from the I/O circuit and provide stored data to the I/O circuit; and a path provider configured to provide an direct path to a target bank or an indirect path to the target bank that is longer than the direct path in response to a plurality of path control signal when data are transmitted between the I/O circuit and the plurality of banks.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
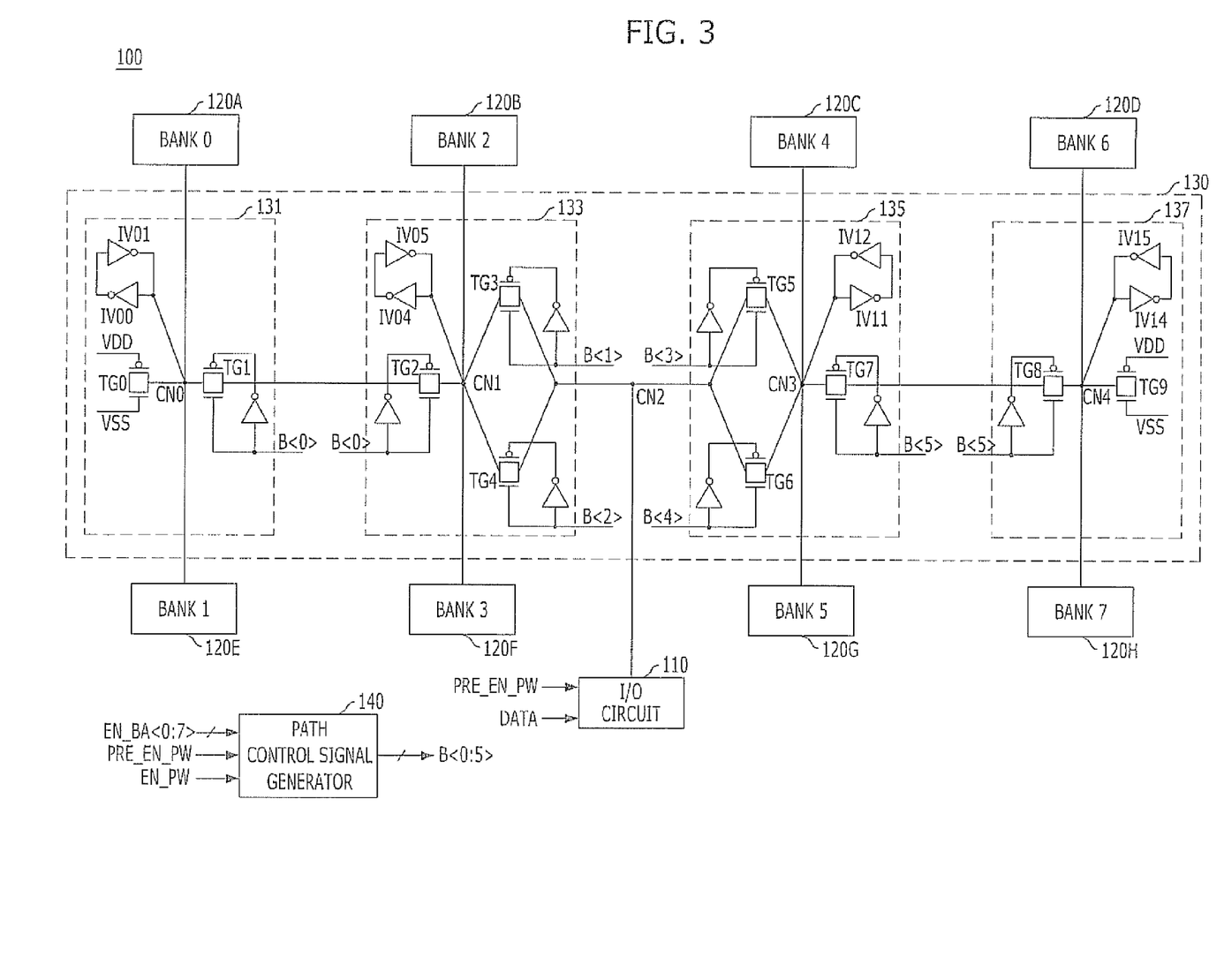
FIG. 3 illustrates a semiconductor memory device in accordance with an embodiment of the present invention.

FIG. 3 illustrates a semiconductor memory device in accordance with an embodiment of the present invention.

Referring to FIG. 3, the semiconductor memory device 100 includes an I/O circuit 110, first to eighth banks 120A to 120H, a path provider 130, and a path control signal generator 140. The I/O circuit 110 is configured to input/output data DATA. The first to eighth banks 120A to 120H are configured to store data transferred from the I/O circuit 110 and provide stored data to the I/O circuit 110. The path provider 130 is configured to provide an indirect path or a direct path in response to first to sixth path control signals B<0:5> when data are transmitted between the I/O circuit 100 and the first to eighth banks 120A to 120H. The path control signal generator 140 is configured to generate the first to sixth path control signals B<0:5> in response to first to eighth bank select signals EN_BA<0:7> and first and second write control signals PRE_EN_PW and EN_PW. Here, the indirect path includes a return path, which will be described below in detail.

Here, the I/O circuit 110 is electrically connected to the center of the path provider 130, that is, between a second path selection unit 133 and a third path selection unit 135, which will be described in detail below.

The first to eighth banks 120A to 120H include first to fourth 20 banks (hereafter, referred to as 'first to fourth upper banks') 120A to 120D arranged in an upper region and spaced at a desired distance (e.g., a constant interval/distance) from each other, and fifth to eighth banks (hereafter, referred to as 'first to fourth lower banks') 120E to 120H arranged in a lower region and spaced at a desired distance (e.g., a constant interval/distance) from each other. The first to fourth upper banks 120A to 120D are arranged so as to oppositely face the first to fourth lower banks 120E to 120H one-to-one, respectively.

Furthermore, the path provider 130 includes first to fourth path selection units 131, 133, 135, and 137 provided between the first to fourth upper banks 120A to 120D and the first to fourth lower banks 120E to 120H in one-to-one correspondence to the first to fourth upper banks 120A to 120D or the first to fourth lower banks 120E to 120H. More specifically, the first to fourth path selection units 131, 133, 135, and 137 are commonly connected to the first to fourth upper banks 120A to 120D and the first to fourth lower banks 120E to 120H, respectively. For example, the first path selection unit 131 is commonly connected to the first upper bank 120A and the first lower bank 120E, the second selection unit 133 is commonly connected to the second upper bank 120B and the second lower bank 120F, the third selection unit 135 is commonly connected to the third upper bank 120C and the third lower bank 120G, and the fourth selection unit 137 is commonly connected to the fourth upper bank 120D and the fourth lower bank 120H. Meanwhile, each of the first to fourth path selection units 131, 133, 135, and 137 is connected to an adjacent path selection unit through a transmission line.

Among the first to fourth path selection units 131, 133, 135, and 137, the first and fourth path selection units 131 and 137 arranged at both sides are designed to provide, for example, only a direct path, and the second and third path selection units 133 and 135 are designed to provide a direct path and an indirect path. The detailed configuration of the first to fourth path selection units 131, 133, 135, and 137 will be described as follows.

The first path selection unit 131 includes a first switching section TG0, a second switching section TG1, and a first latch section IV00 and IV01. The first switching section TG0 is electrically connected to a first connection node CN0 to which the first upper bank 120A and the first lower bank 120E are commonly connected and is configured to operate in response to a power supply voltage VDD and a ground voltage VSS as shown. The second switching section TG1 is configured to selectively connect the first connection node CN0 with the second path selection unit 133 in response to the first path control signal B<0>. The first latch section IV00 and IV01 is electrically connected to the first connection node CN0. Here, the first and second switching sections TG0 and TG1 may comprise transmission gates. Meanwhile, the first switching section TG0 and the first latch section IV00 and IV01 are provided to operate as a dummy so that the first upper bank 120A and the first lower bank 120E have the same path characteristic as the other banks 120B to 120H and their use is not necessary. The first path selection unit 131 configured in such a manner provides, for example, only a direct path to directly transmit data to the first connection node CN0 through the second switching section TG1 when the data is transmitted to the first upper bank 120A or the first lower bank 120E.

The second path selection unit 133 includes a third switching section TG2, a second latch section IV04 and IV05, a fourth switching section TG3, and a fifth switching section TG4. The third switching section TG2 is configured to selectively connect the first path selection unit 131 with a second connection node CN1 to which the second upper bank 120B and the second lower bank 120F are commonly connected, in response to the first path control signal B<0>. The second latch section IV04 and IV05 is electrically connected to the second connection node CN1. The fourth switching section TG3 is configured to selectively connect the second connection node CN1 with a third connection node CN2 in response to the second path control signal B<1>. The fifth switching section TG4 is connected in parallel to the fourth switching section TG3 and configured to selectively connect the second connection node CN1 with the third connection node CN2 in response to the third path control signal B<2>. Here, the third to fifth switching sections TG2 to TG4 may include transmission gates. The second path selection unit 133 configured in such a manner provides a direct path to directly connect the second and third connection nodes CN1 and CN2 through the fourth or fifth switching section TG3 or TG4 when data is transmitted to the second upper bank 120B or the second lower bank 120F, and provides a return path to return data to the third connection node CN2 via the fourth and fifth switching sections TG3 and TG4 when the data is transmitted to the third upper bank 120C or the third lower bank 120G.

The return path in accordance with the embodiment of the present invention is described as follows. When data is transmitted to a bank arranged at a relatively remote position from the I/O circuit 110, for example, the fourth upper bank 120D, line loading is reflected more than when data is transmitted to a bank arranged at a relatively close position from the I/O circuit 110, for example, the third upper bank 120C. Therefore, when the data is transmitted to the bank arranged at a relatively close position, line loading that is different for each bank may be compensated by controlling the data to pass through the return path.

The third path selection unit 135 includes a sixth switching section TG5, a seventh switching section TG6, an eighth switching section TG7, and a third latch section IV11 and IV12. The sixth switching section TG5 is configured to selectively connect the third connection node CN2 with a fourth connection node CN3 to which the third upper bank 120 and the third lower bank 120G are commonly connected, in response to the fourth path control signal B<3>. The seventh switching section TG6 is connected in parallel to the sixth switching section TG5 and configured to selectively connect the fourth connection node CN3 with the third connection node CN2 in response to the fifth path control signal B<4>. The eighth switching section TG7 is configured to selectively connect the fourth connection node CN3 with the fourth path selection unit 137 in response to the sixth path control signal B<5>. The third latch section IV11 and IV12 is electrically connected to the fourth connection node CN3. Here, the sixth and eighth switching section TG5 and TG7 may include transmission gates. The third path selection unit 135 configured in such a manner provides a direct path to directly connect the third and fourth connection nodes CN2 and CN3 through the sixth or seventh switching section TG5 or TG6 when data is transmitted to the third upper bank 120C or the lower bank 120G and provides a return path to return data to the third connection node CN2 via the sixth and seventh switching sections TG5 and TG6 when the data is transmitted to the third upper bank 120C or the third lower bank 120G.

The fourth path selection unit 137 includes a ninth switching section TG8, a tenth switching section TG9, and a fourth latch section IV14 and IV15. The ninth switching section TG8 is configured to selectively connect the third path selection unit 135 with a fifth connection node CN4 to which the fourth upper bank 120D and the fourth lower bank 120H are commonly connected, in response to the sixth path control signal B<5>. The tenth switching section TG9 is electrically connected to the fifth connection node CN4 and configured to operate in response to the power supply voltage VDD and the ground voltage VSS (as shown). The fourth latch section IV14 and IV15 is electrically connected to the fifth connection node CN4. Here, the ninth and tenth switching sections TG8 and TG9 may include transmission gates. Meanwhile, the tenth switching section TG9 and the fourth latch section IV14 and IV15 are provided to operate as a dummy type so that the fourth upper bank 120D and the fourth lower bank 120H have the same path characteristic as the other banks 120A, 120B, 120C, 120E, 120F, and 120G, and their use is not necessary. The fourth path selection unit 137 configured in such a manner provides, for example, only a direct path to directly transmit data to the fifth connection node CN4 through the ninth switching section TG8 when the data is transmitted to the fourth upper bank 120D or the fourth lower bank 120H.

Figure 4:
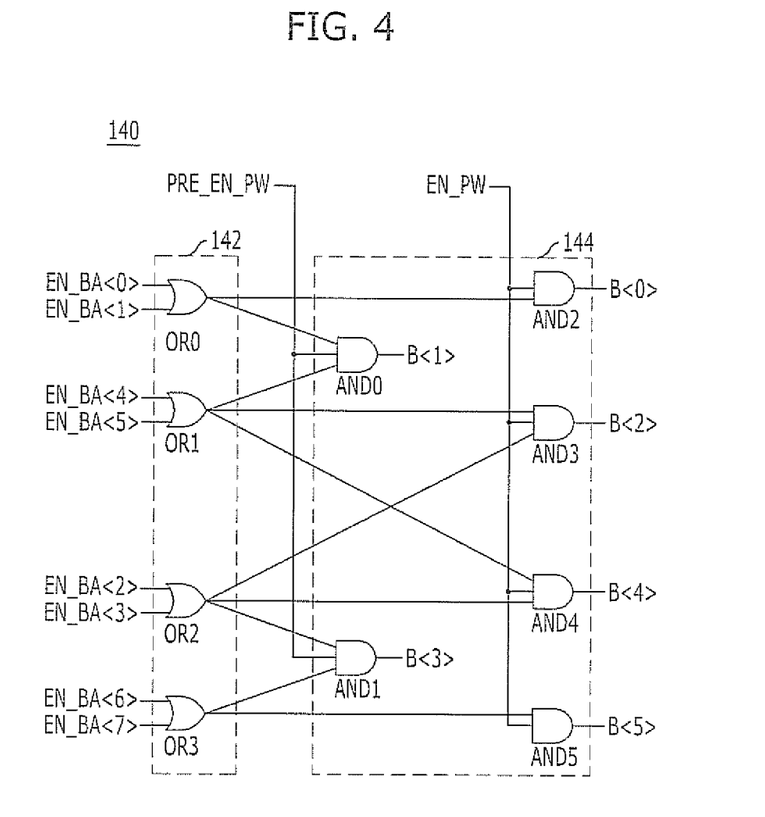
FIG. 4 is an internal configuration diagram of the path control signal generator 140 illustrated in FIG. 3.

FIG. 4 is an internal configuration diagram of the path control signal generator 140 illustrated in FIG. 3.

Referring to FIG. 4, the path control signal generator 140 includes a first logic combination unit 142 and a second logic combination unit 144. The first logic combination unit 142 is configured to logically combine the first to eighth bank select signals EN_BA<0:7>. The second logic combination unit 144 is configured to logically combine an output signal of the first logic combination unit 142 and the first and second write control signals PRE_EN_PW and EN_PW, and output the first to sixth path control signals B<0:5>.

Here, the first logic combination unit 142 includes first to fourth OR gates OR0 to OR3. The first OR gate OR0 is configured to perform an OR operation on the first bank select signal EN_BA<0> for enabling the first upper bank 120A and the second bank select signal EN_BA<1> for enabling the first lower bank 120E. The second OR gate OR1 is configured to perform an OR operation on the fifth bank select signal EN_BA<4> for enabling the third upper bank 120C and the sixth bank select signal EN_BA<5> for enabling the third lower bank 20G. The third OR gate OR2 is configured to perform an OR operation on the third bank select signal EN_BA<2> for enabling the second upper bank 120B and the fourth bank select signal EN_BA<3> for enabling the second lower bank 120F. The fourth OR gate OR4 is configured to perform an OR operation on the seventh bank select signal EN_BA<6> for enabling the fourth upper bank 120D and the eighth bank select signal EN_BA<7> for enabling the fourth lower bank 120H.

The second logic combination unit 144 includes first to sixth AND gates AND0 to AND5. The first AND gate AND0 is configured to perform an AND operation on the first write control signal PRE_EN_PW, an output signal of the first OR gate OR0, and an output signal of the second OR gate OR1 and output the second path control signal B<1>. The second AND gate AND1 is configured to perform an AND operation on the first write control signal PRE_EN_PW, an output signal of the third OR gate OR2, and an output signal of the fourth OR gate OR3 and output the fourth path control signal B<3>. The third AND gate AND2 is configured to perform an AND operation on the second write control signal B<0> and the output signal of the first OR gate OR0 and output the first path control signal B<0>. The fourth AND gate AND3 is configured to perform an AND operation on the second write control signal EN_PW, the output signal of the second OR gate OR1, and the output signal of the third OR gate OR2 and output the third path control path signal B<2>. The fifth AND gate AND4 is configured to perform an AND operation on the second write control signal EN_PW, the output signal of the second OR gate OR1, and the output signal of the third OR gate OR2 and output the fifth path control signal B<4>. The sixth AND gate AND5 is configured to perform an AND operation on the second write control signal EN_PW and the output signal of the fourth OR gate OR3 and output the sixth path control signal B<5>.

Here, the first and second write control signals PRE_EN_PW and EN_PW are derived from a write command. For example, the first and second write control signal PRE_EN_PW and EN_PW may be obtained by sequentially delaying the write command. In particular, the first write control signal PRE_EN_PW may be activated before the second write control signal EN_PW such that the activation periods of the first and second write control signals PRE_EN_PW and EN_PW do not overlap each other.

Hereafter, a method for driving the semiconductor device in accordance with the embodiment of the present invention will be described with reference to FIGS. 5A to 6.

Figure 5A:
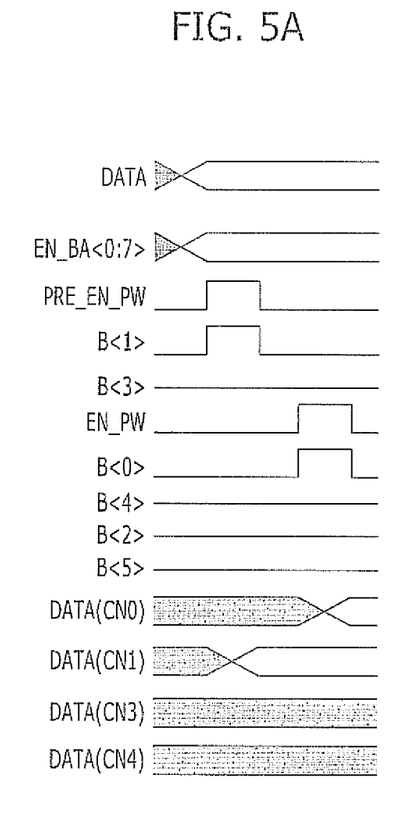
FIGS. 5A to 5D are timing diagrams illustrating a method for driving the semiconductor device in accordance with the embodiment of the present invention.
Figure 5B:
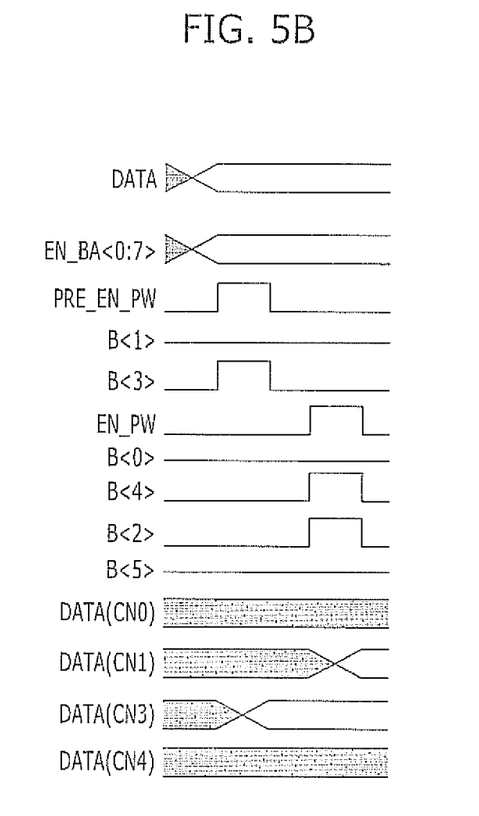
Figure 5C:
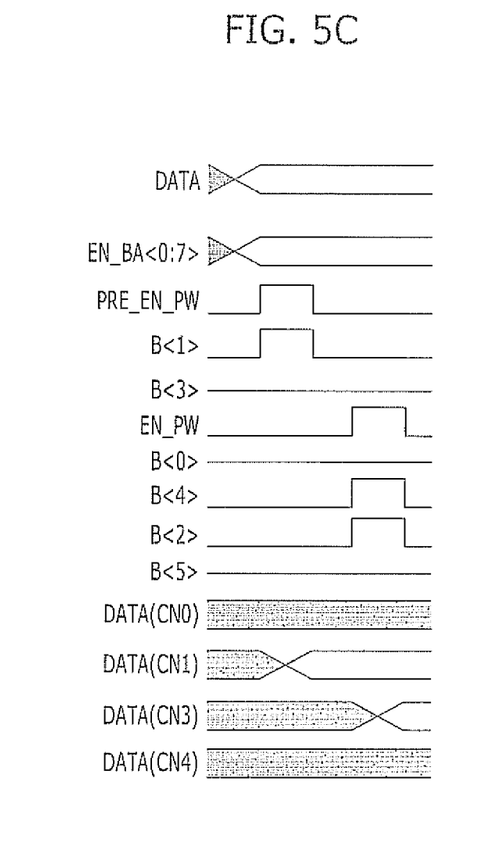
Figure 5D:
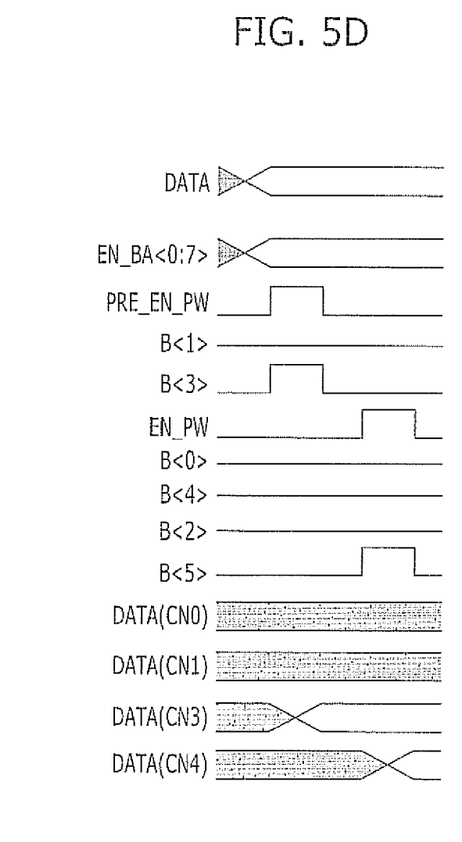

FIG. 5A is a timing diagram illustrating a case in which data is written into the first upper bank 120A or the first lower bank 120E. FIG. 5B is a timing diagram illustrating a case in which data is written into the second upper bank 120B or the second lower bank 120F. FIG. 5C is a timing diagram illustrating a case in which data is written into the third upper bank 120C or the third lower bank 120G. FIG. 5D is a timing diagram illustrating a case in which data is written into the fourth upper bank 120D or the fourth upper bank 120H.

First, referring to FIG. 5A, the method in accordance with the embodiment of the present invention will be described. For illustration purposes, the following descriptions will be focused on an operation of writing data into the first upper bank 120A.

When the first write control signal PRE_EN_PW is activated in a state where, for example, only the first bank select signal EN_BA<0> of the first to eighth bank select signals EN_BA<0:7> is activated, the I/O circuit 110 transmits data, which is to be written, to the path provider 130. At this time, the path control signal generator 140 logically combines the first to eighth bank select signals EN_BA<0:7> and the first write control signal PRE_EN_PW and activates the second path control signal B<1> for a desired period. Subsequently, the data transmitted to the path provider 130 is transferred to the second path selection unit 133. That is, the data transmitted to the path provider 130 is latched in the second latch section IV04 and IV05 via the fourth switching section TG3 turned on in response to the second path control signal B<1>.

Subsequently, when the second write control signal EN_PW is activated, the path control signal generator 140 logically combines the first to eighth bank select signals EN_BA<0:7> and the second write control signal EN_PW and activates the first path control signal B<0> for a desired period. Subsequently, data having passed through the second path selection unit 133 is inputted to the enabled first upper bank 120A through the first path selection unit 131. More specifically, the data latched in the second latch section IV04 and IV05 is transmitted to the first upper bank 120A via the third and second switching sections TG2 and TG1 turned on in response to the first path control signal B<0>.

Therefore, the path where the data transmitted through the I/O circuit 110 is written into the first upper bank 120A includes, for example, only a direct path where the data sequentially passes through the third connection node CN2, the fourth switching section TG3, the second connection node CN1, the third switching section TG2, the second switching section TG1, and the first connection node CN0 (I/O circuit 110→CN2→TG3→CN1→TG2→TG1→CN0→BANK0).

Next, referring to FIG. 5B, the method in accordance with the embodiment of the present invention will be described. For illustration purposes, the following descriptions will be focused on an operation of writing data into the second upper bank 120B.

When the first write control signal PRE_EN_PW is activated in a state where, for example, only the third bank select signal EN_BA<2> of the first to eighth bank select signals EN_BA<0:7> is activated, the I/O circuit 110 transmits data, which is to be written, to the path provider 130. At this time, the path control signal generator 140 logically combines the first to eighth bank select signals EN_BA<0:7> and the first write control signal PRE_EN_PW and activates the fourth path control signal B<3> for a desired period. Subsequently, the data transmitted to the path provider 130 is transferred to the third path selection unit 135. That is, the data transmitted to the path provider 130 is latched in the third latch section IV11 and IV12 via the sixth switching section TG5 turned on in response to the fourth path control signal B<3>.

When the second write control signal EN_PW is activated, the path control signal generator 140 logically combines the first to eighth bank select signals EN_BA<0:7> and the second write control signal EN_PW and activates the fifth and third path control signal B<4> and B<2> for a desired period. Subsequently, the data inputted to the third path selection unit 135 is returned to the input terminal CN2 of the third path selection unit 135 and inputted to the enabled second upper bank 120B through the second path selection unit 133. More specifically, the data latched in the third latch section IV11 and IV12 is transmitted to the second upper bank 120B via the seventh and fifth switching sections TG6 and TG4 turned on in response to the fifth and third path control signals B<4> and B<2>.

Therefore, the path where the data transmitted through the I/O circuit 110 is written into the second upper bank 120B includes a return/indirect path where the data sequentially passes through the third connection node CN2, the sixth switching section TG5, the fourth connection node CN3, the seventh switching section TG6, and the third connection node CN2 (I/O circuit 110→CN2→TG5→CN3→TG6→CN2) and a direct path where the data sequentially passes through the third connection node CN2, the fifth switching section TG4, and the second connection node CN1 (CN2→TG3→CN1→BANK2).

Continuously, referring to FIG. 5C, the method in accordance with the embodiment of the present invention will be described. For illustration purposes, the following descriptions will be focused on an operation of writing data into the third upper bank 120C.

When the first write control signal PRE_EN_PW is activated in a state where, for example, only the fifth bank select signal EN_BA<4> of the first to eighth bank select signals EN_BA<0:7> is activated, the I/O circuit 110 transmits data, which is to be written, to the path provider 130. At this time, the path control signal generator 140 logically combines the first to eighth bank select signals EN_BA<0:7> and the first write control signal PRE_EN_PW and activates the second path control signal B<1> for a desired period. Subsequently, the data transmitted to the path provider 130 is transferred to the second path selection unit 133. That is, the data transmitted to the path provider 130 is latched in the second latch section IV04 and IV05 via the fourth switching section TG3 turned on in response to the second path control signal B<1>.

When the second write control signal EN_PW is activated, the path control signal generator 140 logically combines the first to eighth bank select signals EN_BA<0:7> and the second write control signal EN_PW and activates the third and fifth path control signal B<2> and B<4> for a desired period. Subsequently, the data inputted to the second path selection unit 133 is returned to the input terminal CN2 of the second path selection unit 133 and inputted to the enabled third upper bank 120C through the second path selection unit 135. More specifically, the data latched in the second latch section IV04 and IV05 is transmitted to the third upper bank 120C via the fifth and seventh switching sections TG4 and TG6 turned on in response to the third and fifth path control signals B<2> and B<4>.

Therefore, the path where the data transmitted through the I/O circuit 110 is written into the third upper bank 120C includes a return path where the data sequentially passes through the third connection node CN2, the fourth switching section TG3, the second connection node CN1, the fifth switching section TG4, and the third connection node CN2 (I/O circuit 110→CN2→TG3→CN1→TG4→CN2) and a direct path where the data sequentially passes through the third connection node CN2, the seventh switching section TG6, and the third connection node CN2 (CN2→TG6→CN3→BANK4).

Finally, referring to FIG. 5D, the method in accordance with the embodiment of the present invention will be described. For illustration purposes, the following descriptions will be focused on an operation of writing data into the fourth upper bank 120D.

When the first write control signal PRE_EN_PW is activated in a state where, for example, only the seventh bank select signal EN_BA<6> of the first to eighth bank select signals EN_BA<0:7> is activated, the I/O circuit 110 transmits data, which is to be written, to the path provider 130. At this time, the path control signal generator 140 logically combines the first to eighth bank select signals EN_BA<0:7> and the first write control signal PRE_EN_PW and activates the fourth path control signal B<3> during a desired period. Subsequently, the data transmitted to the path provider 130 is transferred to the third path selection unit 135. That is, the data transmitted to the path provider 130 is latched in the third latch section IV11 and IV12 via the sixth switching section TG5 turned on in response to the fourth path control signal B<3>.

Subsequently, when the second write control signal EN_PW is activated, the path control signal generator 140 logically combines the first to eighth bank select signals EN_BA<0:7> and the second write control signal EN_PW and activates the sixth path control signal B<5> for a desired period. Subsequently, the data having passed through the third path selection unit 135 is inputted to the enabled fourth upper bank 120D through the fourth path selection unit 137. More specifically, the data latched in the third latch section IV11 and IV12 is transmitted to the fourth upper bank 120D via the eighth and ninth switching sections TG7 and TG8 turned on in response to the sixth path control signal B<5>.

Therefore, the path where the data transmitted through the I/O circuit 110 is written into the fourth upper bank 120D includes, for example, only a direct path where the data sequentially passes through the third connection node CN2, the sixth switching section TG5, the fourth connection node CN3, the eighth switching section TG7, the ninth switching section TG8, and the fifth connection node CN4 (I/O circuit 110→CN2→TG5→CN3→TG7→TG8→CN4→BANK6).

Figure 6:
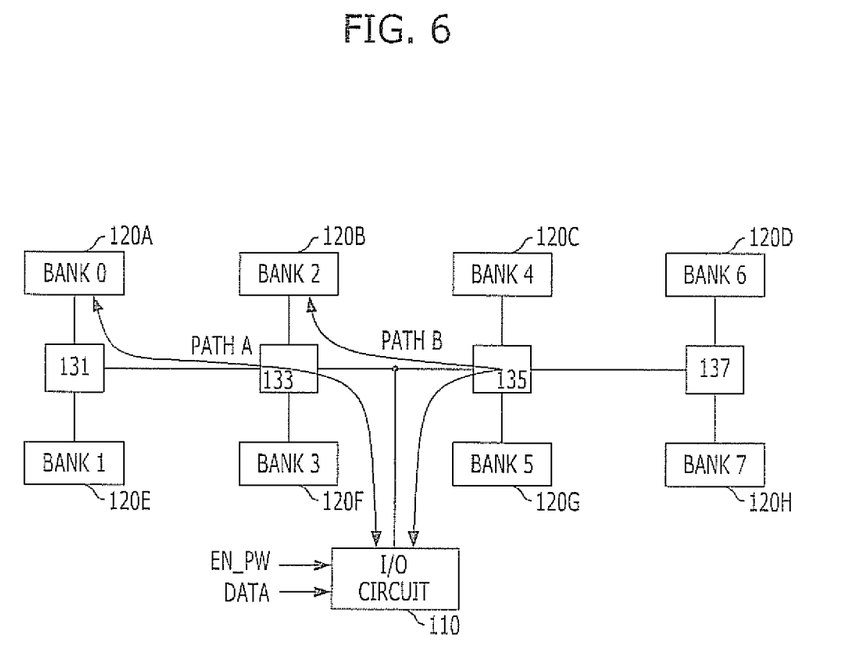
FIG. 6 illustrates an example of the data path based on FIGS. 5A and 5B.

FIG. 6 illustrates an example of the data path based on FIGS. 5A and 5B.

Referring to FIG. 6, it can be seen that a data path A from the I/O circuit 110 to the first upper bank 120A and a data path B from the I/O circuit 110 to the second upper bank 120B have such a characteristic that the same line loading is reflected. Although not illustrated, data paths from the I/O circuit 100 to the other banks including the third and fourth upper banks 120C and 120D and the first to fourth lower banks 120E to 120H have such a characteristic that the same line loading is reflected.

In accordance with the embodiment of the present invention, as the path characteristics are reflected in the same manner regardless of the positions of the respective banks, data skew may be minimized. Furthermore, as the numbers of additional paths and circuits are minimized/reduced in comparison to the conventional semiconductor device, the area may be minimized/reduced.

While the present invention has been described with respect to the specific embodiments, it will be apparent to those skilled in the art that various changes and modifications may be made without departing from the spirit and scope of the invention as defined in the following claims.

In this embodiment of the present invention, a write operation has been taken as an example for illustration purposes. However, the present invention is not limited to the write operation, but may be applied to a read operation. For example, when the present invention is applied to the read operation, the switching sections may be controlled in the opposite order from the write operation.

What is claimed is:

1. A semiconductor device comprising:
an I/O circuit configured to input/output a data signal;
a plurality of internal circuits configured to transmit and receive the data signal to/from the I/O circuit;
a path provider configured to select one of a direct path to a target internal circuit or an indirect path to the target internal circuit that is longer than the direct path in response to one or more path control signals and use the selected path when the data signal is transmitted between the I/O circuit and the plurality of internal circuits; and
a path control signal generation unit suitable for generating one or more path control signals in response to internal circuit selection signals and first and second write control signals.

2. The semiconductor device of claim 1, wherein the indirect path comprises a return path for returning the data signal to a node that transmitted the data signal returned through the return path.

3. The semiconductor device of claim 1, wherein the plurality of internal circuits comprises:
first internal circuits corresponding to a half of the plurality of internal circuits that are on one side; and
second internal circuits corresponding to the other half of the plurality of internal circuits that are on the opposite side,
wherein each of the first internal circuits is arranged to oppositely face a corresponding one of the first internal circuits.

4. The semiconductor device of claim 3, wherein the path provider is disposed between the first internal circuits and the second internal circuits.

5. The semiconductor device of claim 3, wherein the path provider comprises a plurality of path selection units corresponding to the first internal circuits, respectively, and corresponding to the second internal circuits, respectively, and
each of the path selection units is connected to the corresponding first and second internal circuits.

6. The semiconductor device of claim 5, wherein each of the path selection units is connected to an adjacent path selection unit through a transmission line.

7. The semiconductor device of claim 5, wherein the path selection units are connected in series and the I/O circuit is electrically connected to a node coupled between two path selection units that are arranged in the center of the series-connected path selection units.

8. The semiconductor device of claim 5, wherein the path selection units are connected in series and the path selection units arranged at the opposite ends of the series-connected path selection units are used to provide the direct path but not the indirect path to the target internal circuit and the path selection units between the path selection units arranged at the opposite ends are used to provide both the direct and indirect paths to the target internal circuit.

9. A semiconductor device comprising:
an I/O circuit configured to input/output data;
a plurality of banks configured to store data transferred from the I/O circuit and provide stored data to the I/O circuit;
a path provider configured to provide an direct path to a target bank or an indirect path to the target bank that is longer than the direct path in response to a plurality of path control signal when data are transmitted between the I/O circuit and the plurality of banks; and
a path control signal generation unit suitable for generating one or more path control signals in response to internal circuit selection signals and first and second write control signals.

10. The semiconductor device of claim 9, wherein the indirect path comprises a return path for returning data to a node that transmitted the data returned through the return path.

11. The semiconductor device of claim 9, wherein the plurality of banks comprise a plurality of upper banks and a plurality of lower banks, and
the plurality of upper banks are arranged to oppositely face the plurality of lower banks, respectively.

12. The semiconductor device of claim 11, wherein the path provider is provided between the plurality of upper banks and the plurality of lower banks.

13. The semiconductor device of claim 11, wherein the path provider comprises a plurality of path selection units corresponding to the plurality of upper banks, respectively, and corresponding to the plurality of lower banks, respectively, and each of the path selection units is connected to the corresponding upper and lower banks.

14. The semiconductor device of claim 13, wherein each of the path selection units is connected to an adjacent path selection unit through a transmission line.

15. The semiconductor device of claim 13, wherein the path selection units are connected in series and the I/O circuit is electrically connected to a node coupled between two path selection units that are arranged in the center of the series-connected path selection units.

16. The semiconductor device of claim 13, wherein the path selection units are connected in series and the path selection units arranged at opposite ends of the series-connected path selection units are used to provide the direct path but not the indirect longer path to the target internal circuit and the path selection units between the path selection units arranged at the opposite ends are used to provide both the direct and indirect paths to the target internal circuit.

17. The semiconductor device of claim 16, wherein each of the path selection units arranged at the opposite ends of the series-connected path selection units comprises a first switching section configured to selectively connect an adjacent path selection unit with a first connection node to which the corresponding upper bank and the lower bank are commonly connected, in response to a first path control signal.

18. The semiconductor device of claim 17, wherein each of the path selection units arranged at the opposite ends of the series-connected path selection units further comprises a first latch section electrically connected to the first connection node.

19. The semiconductor device of claim 16, wherein each of the other selection units other than the path selection units arranged at the opposite ends of the series-connected path selection units comprises:
a second switching section configured to selectively connect a path selection unit adjacent to one end thereof with a second connection node to which the corresponding upper and lower banks are commonly connected, in response to the first path control signal;
a second latch section electrically connected to the second connection node;
a third switching section configured to selectively connect the second connection node with a path selection unit adjacent to the other end thereof, in response to a second path control signal; and
a fourth switching section connected in parallel to the third switching section and configured to selectively connect the second connection node with the path selection unit adjacent to the other end thereof, in response to a third path control signal.

* * * * *